United States Patent
Furudate

(10) Patent No.: US 8,476,903 B2
(45) Date of Patent: Jul. 2, 2013

(54) MAGNETIC RESONANCE IMAGING APPARATUS

(75) Inventor: Naoyuki Furudate, Otawara (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 372 days.

(21) Appl. No.: 13/004,454

(22) Filed: Jan. 11, 2011

(65) Prior Publication Data

US 2011/0169490 A1    Jul. 14, 2011

(30) Foreign Application Priority Data

Jan. 13, 2010    (JP) .................................. 2010-005325
Nov. 17, 2010    (JP) .................................. 2010-257030

(51) Int. Cl.
*G01V 3/00*    (2006.01)

(52) U.S. Cl.
USPC ......................................... 324/307; 324/309

(58) Field of Classification Search
USPC ........................... 324/307, 309, 314, 318, 322
See application file for complete search history.

(56) References Cited

U.S. PATENT DOCUMENTS

| | | | |
|---|---|---|---|
| 8,217,648 B2* | 7/2012 | Kachi et al. .................... | 324/307 |
| 2003/0095144 A1* | 5/2003 | Trevino et al. ................. | 345/764 |
| 2004/0109028 A1* | 6/2004 | Stern et al. ..................... | 345/771 |
| 2010/0271840 A1* | 10/2010 | Hamada et al. ................ | 362/606 |
| 2011/0113376 A1* | 5/2011 | Suzuki et al. .................. | 715/833 |
| 2013/0033264 A1* | 2/2013 | Sugiura .......................... | 324/318 |

FOREIGN PATENT DOCUMENTS

| | | |
|---|---|---|
| JP | 2003-225222 | 8/2003 |
| JP | 2009-148463 | 7/2009 |

* cited by examiner

*Primary Examiner* — Louis Arana
(74) *Attorney, Agent, or Firm* — Nixon & Vanderhye PC

(57) ABSTRACT

A Magnetic Resonance Imaging (MRI) apparatus according to an embodiment can execute a plurality of kinds of protocols varying in image contrast, and includes a storage unit and an output unit. The storage unit stores imaging conditions about the plurality of kinds of protocols. The output unit outputs onto a display unit an edit screen for receiving edit of a parameter that is an element of the imaging conditions. The edit screen is output by being separated into a common part that receives edit of parameter common to a plurality of kinds of protocols varying in image contrast, and an individual part that individually receives edit of parameter with respect to each protocol.

20 Claims, 11 Drawing Sheets

FIG.4

| | PARAMETER | SET VALUE | SETTABLE RANGE |
|---|---|---|---|
| PROTOCOL #1 | Imaging Flip Angle | 90 | 1, 100, 1 |
| | Acquisition Order | Forward | |
| | PE FOV | 24.0 | 8.2, 50.0, 0.1 |
| | sequence Identifier | SE12 | |
| | TR | 540.0 | 24.0, 10000.0, 0.1 |
| | NAQ | 1.3 | 1.0, 64.0, 0.1 |
| | PE Matrix | 208 | 32, 512, 1 |

| | PARAMETER | SET VALUE | SETTABLE RANGE |
|---|---|---|---|
| PROTOCOL #2 | Imaging Flip Angle | 90 | 1, 100, 1 |
| | Acquisition Order | Forward | |
| | PE FOV | 24.0 | 8.2, 50.0, 0.1 |
| | sequence Identifier | FSE+15 | |
| | TR | 20000.0 | 214.0, 20000.0, 0.1 |
| | NAQ | 2.0 | 1.0, 64.0, 0.1 |
| | PE Matrix | 224 | 64, 512, 1 |

FIG.5

```xml
<?xml version="1.0" encoding="UTF-8" ?>
<ScanEditDic>  ← a
 <template name="Main" class="TabBoard">
  <template name="Core" class="Board" rows="8" cols="2">  ← b
   <portion name="Flip" label="Imaging¥nFlip Ang" class="Scale" plif="imagingFlipAngle" />
   <portion name="Slice" label="No.Slice" class="Scale" plif="totalNumberSlices" />
   <portion name="forwardAcquisition" label="Acq.¥nOrder" row="0" col="1" class="Option" plif="forwardAcquisition">Forward,1,Reverse,0,Centric,2</portion>
   <portion name="PEFOV" label="PE FOV" class="Scale" unit="100" decimals="1" plif="PEFOV">
    <dialog name="Dialog" class="Dialog" rows="2" cols="1">
     <portion name="PEFOV" label="PE FOV" class="Scale" unit="100" decimals="1" plif="PEFOV" />
     <portion name="ROFOV" label="RO FOV" class="Scale" unit="100" decimals="1" plif="ROFOV" />
    </dialog>
   </portion>
   <portion name="Seq" label="Pr. #1" class="Button" row="3" col="0" plif="#1.sequenceIdentifier" />
   <portion name="Seq" label="Pr. #2" class="Button" row="3" col="1" plif="#2.sequenceIdentifier" />
   <portion name="TR" label="TR #1" row="4" col="0" class="Scale" unit="1000" decimals="1" plif="#1.TR" />
   <portion name="TR" label="TR #2" row="4" col="1" class="Scale" unit="1000" decimals="1" plif="#2.TR" />
   <portion name="Naq" label="NAQ #1" row="5" col="0" class="Scale" decimals="1" plif="#1.NEX" />
   <portion name="Naq" label="NAQ #2" row="5" col="1" class="Scale" decimals="1" plif="#2.NEX" />
   <portion name="PEMatrix" label="PE #1-¥nMatrix" row="6" col="0" class="Scale" plif="#1.PEMatrix">
    <dialog name="Dialog" class="Dialog" rows="2" cols="1">
     <portion name="PEMatrix" label="PE #1-¥nMatrix" class="Scale" plif="#1.PEMatrix" />
     <portion name="ROMatrix" label="RO #1-¥nMatrix" class="Scale" plif="#1.ROMatrix" />
    </dialog>
   </portion>
   <portion name="PEMatrix" label="PE #2-¥nMatrix" row="6" col="1" class="Scale" plif="#2.PEMatrix">
    <dialog name="Dialog" class="Dialog" rows="2" cols="1">
     <portion name="PEMatrix" label="PE #2-¥nMatrix" class="Scale" plif="#2.PEMatrix" />
     <portion name="ROMatrix" label="RO #2-¥nMatrix" class="Scale" plif="#2.ROMatrix" />
    </dialog>
   </portion>
  </template>  ← b
  <template name="RF Pulse" class="Board" rows="8" cols="2">
     ⋮
</ScanEditDic>  ← a
```

FIG.6A

```
<portion name="PEFOV" label="PE FOV" class="Scale" unit="100" decimals="1"plif="PEFOV" />
```

FIG.6B

```
<portion name="TR" label="TR #1" row="4" col="0" class="Scale" unit="1000"decimals="1" plif="#1.TR" />
```

FIG.6C

```
<portion name="TR" label="TR #2" row="4" col="1" class="Scale" unit="1000"decimals="1" plif="#2.TR" />
```

FIG.7

| Core | RF pulse | Geometry | Gate |
|---|---|---|---|

| | | | | | |
|---|---|---|---|---|---|
| Imaging Flip Ang | 1 | ▶ 90 ◀ | 100 | Acq. Order | Forward |
| No.Slice | 1 | ▶ 23 ◀ | 128 | PE FOV | 8.2 ▶ 24.0 ◀ 50.0  ⌐b |
| Pr. #1 | | SE12 | | Pr. #2 | FSE+15 |
| TR #1 | 24.0 | ▶ 540.0 ◀ | 10000.0 | TR #2 | 214.0 ▶ 20000.0 ◀ 20000.0 |
| NAQ #1 | 1.0 | ▶ 1.3 ◀ | 64.0 | NAQ #2 | 1.0 ▶ 2.0 ◀ 64.0 |
| PE #1-Matrix | 32 | ▶ 208 ◀ | 512 | ☐ PE #2-Matrix | 64 ▶ 224 ◀ 512 |

Close

FIG.11A

```
<portion name="TR" label="TR #1" row="4" col="0" class="Scale" unit="1000"
decimals="1" plif="#1.TR" />
<portion name="TR" label="TR #2" row="4" col="1" class="Scale" unit="1000"
decimals="1" plif="#2.TR" />
```

FIG.11B

```
<portion name="TR" label="TR #1" row="4" col="0" class="Scale" unit="1000"
decimals="1" plif="#1.TR" />
<portion name="TR" label="TR #2" row="4" col="1" class="Scale" unit="1000"
decimals="1" plif="#2.TR" />
<portion name="TR" label="TR #3" row="4" col="1" class="Scale" unit="1000"
decimals="1" plif="#3.TR" />
```

MAGNETIC RESONANCE IMAGING APPARATUS

CROSS-REFERENCE TO RELATED APPLICATIONS

This application is based upon and claims the benefit of priority from Japanese Patent Application No. 2010-005325, filed on Jan. 3, 2010; and Japanese Patent Application No. 2010-257030, filed on Nov. 17, 2010, the entire contents of all of which are incorporated herein by reference.

FIELD

Embodiments described herein relate generally to a magnetic resonance imaging apparatus.

BACKGROUND

Imaging by a magnetic resonance imaging apparatus (hereinafter, "MRI apparatus") is performed in accordance with preset imaging conditions. The imaging conditions include parameters as elements, such as a Flip Angle (FA) of Radio Frequency (RF) pulse, a Field Of View (FOV) in a Phase Encoding (PE) direction, and a Repetition Time (TR).

Imaging conditions vary generally with respect to each protocol. Here, a protocol represents the type of imaging, for example, imaging for acquiring a longitudinal-relaxation weighted (T1-weighted (T1W)) image, imaging for acquiring a transverse-relaxation weighted (T2-weighted (T2W)) image, imaging for acquiring a Diffusion-weighted (DW) image, imaging for acquiring a Magnetic Resonance Angiographic (MRA) image using a flowing-in effect, imaging for acquiring a functional Magnetic Resonance Imaging (fMRI) image using a Blood Oxygenation Level Dependent (BOLD) effect, imaging for acquiring an image using a contrast agent, or the like. For this reason, setting of imaging conditions including various parameters as elements is complicated for an operator, and conventionally, a technology of providing a screen on which a group of minimum required parameters are arranged in a concentrated manner is proposed (JP-A 2003-225222 (KOKAI)).

However, according to the above conventional technology, a heavy burden is still placed on an operator. In other words, when setting imaging conditions including various parameters as elements with respect to a plurality of protocols, for example, the operator has to open imaging-condition edit screens for respective protocols, and to set imaging conditions with respect to each protocol, thereby bearing a heavy burden.

BRIEF DESCRIPTION OF THE DRAWINGS

FIG. 4 is a schematic diagram for explaining a protocol-information storage unit 23*a*;

FIG. 5 is a schematic diagram for explaining an imaging-condition edit-screen definition storage unit 23*b*;

FIGS. 6A to 6C are schematic diagrams for explaining definition information about each parameter;

FIG. 7 is a schematic diagram for explaining an imaging-condition edit screen;

FIGS. 11A and 11B are schematic diagrams for explaining edit of imaging-condition edit-screen definitions.

DETAILED DESCRIPTION

A Magnetic Resonance Imaging (MRI) apparatus according to an embodiment of can execute a plurality of kinds of protocols varying in image contrast, and includes a storage unit and an output unit. The storage unit stores imaging conditions about the plurality of kinds of protocols. The output unit outputs onto a display unit an edit screen for receiving edit of a parameter that is an element of the imaging conditions. The edit screen is output by being separated into a common part that receives edit of parameter common to a plurality of kinds of protocols varying in image contrast, and an individual part that individually receives edit of parameter with respect to each protocol.

Exemplary embodiments of a Magnetic Resonance Imaging (MRI) apparatus will be explained below in detail with reference to the accompanying drawings.

Figure 1:
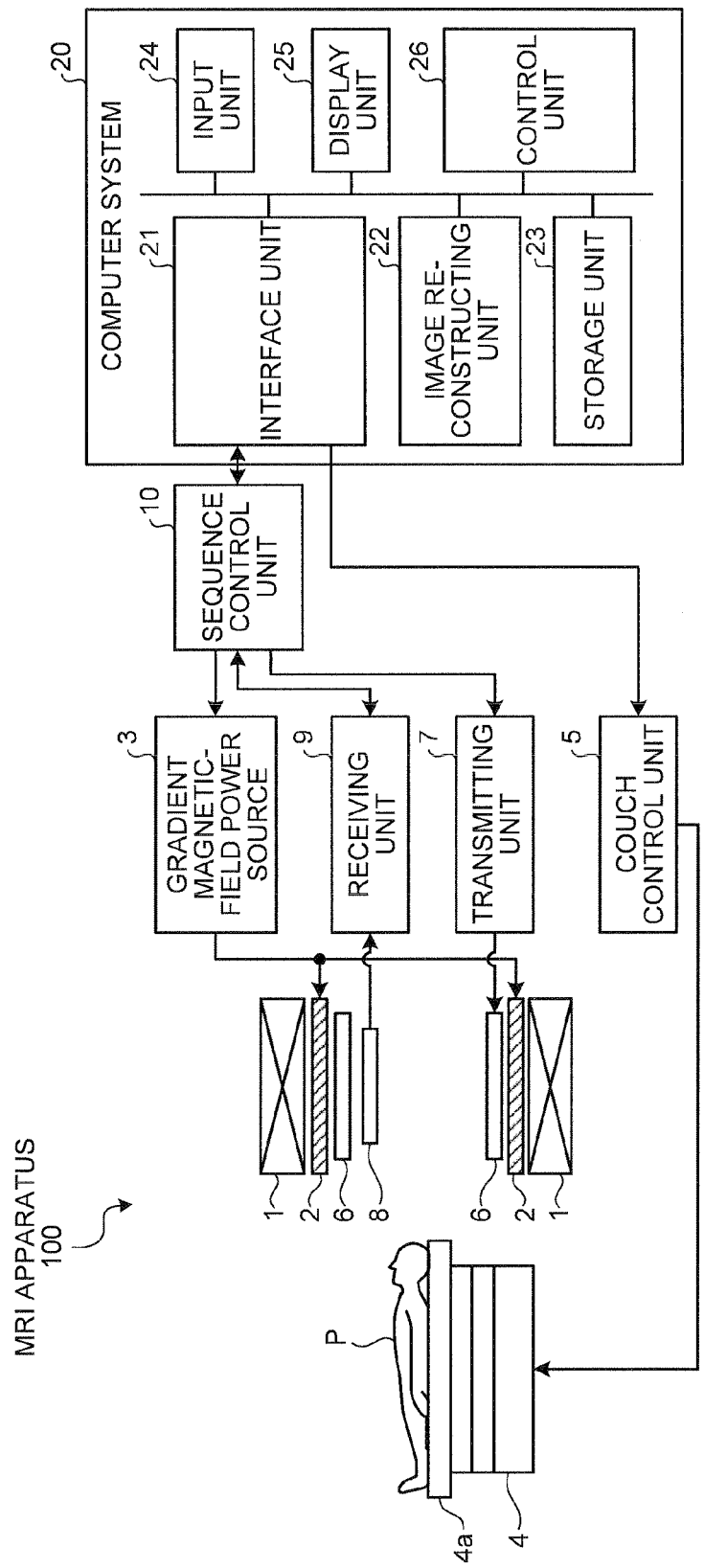
FIG. 1 is a functional block diagram of a configuration of a Magnetic Resonance Imaging (MRI) apparatus according to a first embodiment.

A configuration of an MRI apparatus 100 according to a first embodiment is explained below with reference to FIG. 1. FIG. 1 is a functional block diagram of a configuration of the MRI apparatus 100 according to the first embodiment. As shown in FIG. 1, the MRI apparatus 100 according to the first embodiment includes a static magnetic-field magnet 1, a gradient coil 2, a gradient magnetic-field power source 3, a couch 4, a couch control unit 5, a transmitting coil 6, a transmitting unit 7, a receiving coil 8, a receiving unit 9, a sequence control unit 10, and a computer system 20.

The static magnetic-field magnet 1 is formed in a hollow drum shape, and generates a uniform static magnetic field in a space in its inside. The static magnetic-field magnet 1 is, for example, a permanent magnet, or a super conducting magnet. The gradient coil 2 is formed in a hollow drum shape, and generates a gradient magnetic field in a space in its inside. Specifically, the gradient coil 2 is arranged on the inner side of the static magnetic-field magnet 1, and generates a gradient magnetic field by receiving supply of a current from the gradient magnetic-field power source 3. The gradient magnetic-field power source 3 supplies a current to the gradient coil 2, in accordance with pulse-sequence execution data sent from the sequence control unit 10.

The couch 4 includes a couchtop 4*a* on which a subject P is to be placed, and inserts the couchtop 4*a* on which the subject P is placed into a hole (a scanning space) of the gradient coil 2. Usually, the couch 4 is placed such that the longitudinal direction of the couch 4 is to be parallel to the central axis of the static magnetic-field magnet 1. The couch control unit 5 moves the couchtop 4*a* in the longitudinal direction and upward and downward by driving the couch 4.

The transmitting coil 6 generates a radio-frequency magnetic field. Specifically, the transmitting coil 6 is arranged on the inner side of the gradient coil 2, and generates a radio-frequency magnetic field by receiving supply of a radio-frequency pulse from the transmitting unit 7. The transmitting unit 7 transmits a radio-frequency pulse corresponding to a Larmor frequency to the transmitting coil 6, in accordance with pulse-sequence execution data sent from the sequence control unit 10.

The receiving coil 8 receives an MRI echo signal. The receiving coil 8 is arranged on the inner side of the gradient coil 2, and receives an MRI echo signal emitted from the subject P owing to an influence of a radio-frequency magnetic field. Moreover, the receiving coil 8 outputs the received MRI echo signal to the receiving unit 9. For example, the receiving coil 8 is a receiving coil for head, a receiving coil for spine, and a receiving coil for abdomen.

The receiving unit 9 creates MRI echo-signal data based on the MRI echo signal output from the receiving coil 8, in accordance with pulse-sequence execution data sent from the sequence control unit 10. Specifically, the receiving unit 9 creates MRI echo-signal data by converting an MRI echo signal output from the receiving coil 8 into digital, and transmits the created MRI echo-signal data to the computer system 20 via the sequence control unit 10.

The sequence control unit 10 controls the gradient magnetic-field power source 3, the transmitting unit 7, and the receiving unit 9. Specifically, the sequence control unit 10 transmits pulse-sequence execution data transmitted from the computer system 20 to the gradient magnetic-field power source 3, the transmitting unit 7, and the receiving unit 9.

The computer system 20 particularly includes an interface unit 21, an image reconstructing unit 22, a storage unit 23, an input unit 24, a display unit 25, and a control unit 26. The interface unit 21 is connected to the sequence control unit 10, and controls input and output of data transmitted and received between the sequence control unit 10 and the computer system 20. The image reconstructing unit 22 reconstructs image data from MRI echo-signal data sent from the sequence control unit 10, and stores the reconstructed image data into the storage unit 23.

The storage unit 23 stores therein image data stored by the image reconstructing unit 22, and other data to be used by the MRI apparatus 100. For example, the storage unit 23 is a semiconductor memory device, such as a Random Access Memory (RAM), a Read-Only Memory (ROM), or a flash memory, or a hard disk or an optical disk.

The input unit 24 receives an imaging instruction, edit of imaging conditions, and the like, from an operator. For example, the input unit 24 is a pointing device, such as a mouse or a trackball, a selecting device, such as a mode switch, and an input device, such as a keyboard. The display unit 25 displays image data, an imaging-condition edit screen, and the like. For example, the display unit 25 is a display device, such as a liquid crystal display.

The control unit 26 controls the MRI apparatus 100 overall by controlling each of the above units. For example, the control unit 26 is an integrated circuit, such as an Application Specific Integrated Circuit (ASIC), a Field Programmable Gate Array (FPGA), or an electronic circuit, such as a Central Processing Unit (CPU), or a Micro Processing Unit (MPU).

According to the MRI apparatus 100 of the first embodiment, with respect to not only a plurality of protocols having the same imaging conditions, but also a plurality of protocols having different imaging conditions, a parameter can be simultaneously edited. Moreover, according to the MRI apparatus 100 of the first embodiment, when a plurality of protocols is arbitrarily specified for imaging at the same station of which the imaging target is the same region of interest, imaging-condition edit screen dedicated for the specified protocols can be dynamically created, and can be output onto the display unit 25. An overview of the MRI apparatus 100 is explained below.

Figure 2:
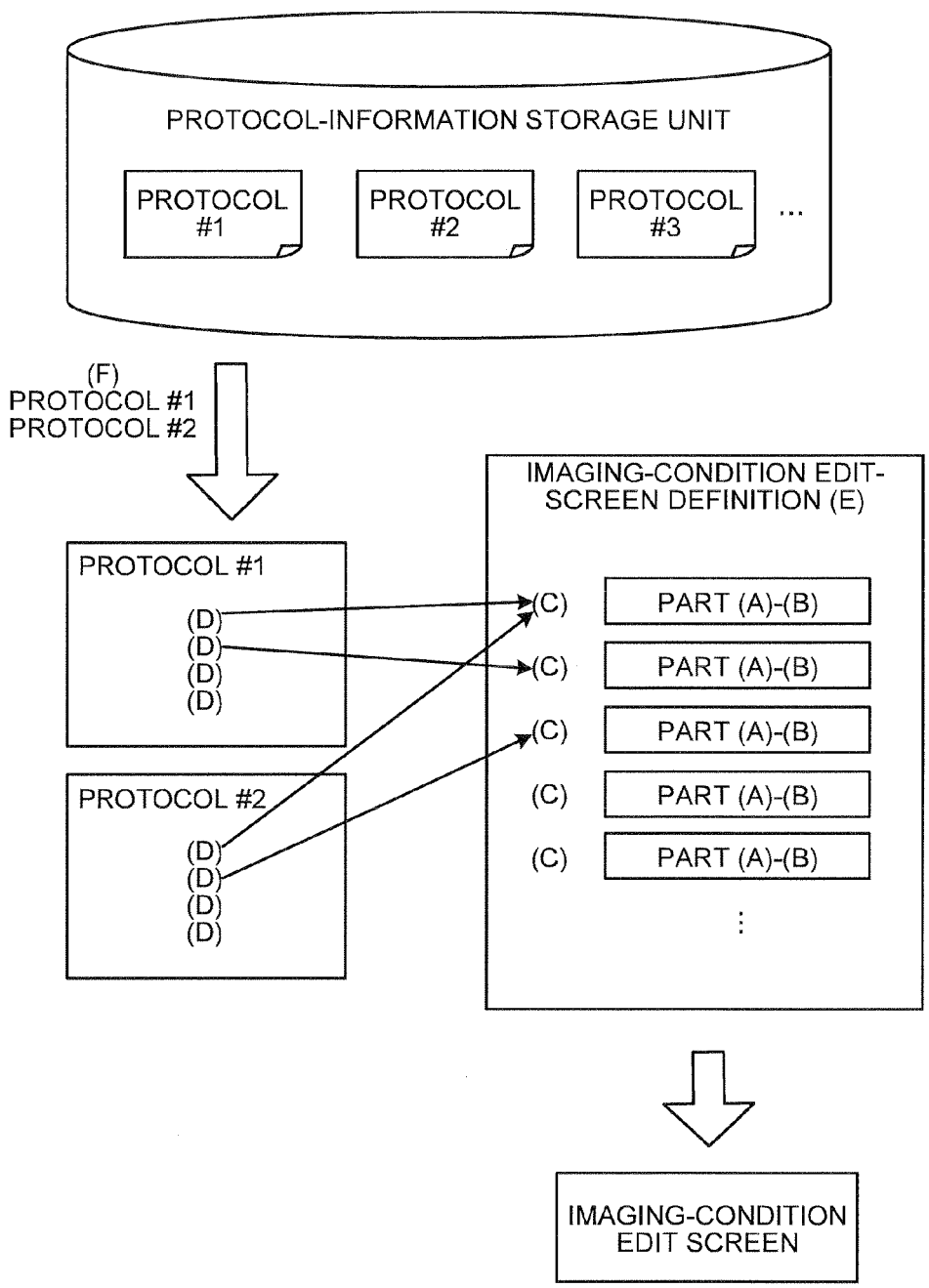
FIG. 2 is a schematic diagram for explaining an overview of an MRI apparatus 100 according to the first embodiment.

FIG. 2 is a schematic diagram for explaining an overview of the MRI apparatus 100 according to the first embodiment. As shown in FIG. 2, the MRI apparatus 100 includes a protocol-information storage unit. The protocol-information storage unit stores a group of set values set in respective parameters that are elements of the imaging conditions, with respect to each protocol.

Moreover, as shown in FIG. 2, the MRI apparatus 100 stores an imaging-condition edit-screen definition (E). The imaging-condition edit-screen definition (E) is definition information that defines with respect to each parameter a command to output an imaging-condition edit-screen for receiving edit of parameter onto the display unit 25. In FIG. 2, definition information about each parameter is a combination of a part (A) and an identifier (B) that identifies a parameter. Assuming that a combination of a part (A) and an identifier (B) is denoted by (C), an imaging-condition edit-screen definition (E) is an aggregation of (C).

Under such configuration, when a plurality of protocol is specified, the MRI apparatus 100 according to the first embodiment refers to a protocol-information storage unit with respect to each of the specified protocols, and acquires a corresponding group of set values with respect to each protocol. For example, as shown in (F) in FIG. 2, when a 'protocol #1', and a 'protocol #2' are specified, the MRI apparatus 100 acquires a group of set values of the 'protocol #1' and a group of set values of the 'protocol #2'. In FIG. 2, a set value is denoted by (D).

Subsequently, as shown in FIG. 2, the MRI apparatus 100 associates the group of set values (D) acquired with respect to each protocol, with the imaging-condition edit-screen definition (E), in accordance with whether it is a parameter of which reception of edit is to common to a plurality of protocols. According to the first embodiment, the identifier (B) identifying a parameter includes information that identifies whether it is a parameter of which reception of edit is to common to a plurality of protocols. For this reason, the MRI apparatus 100 determines whether set values (D) of a plurality of protocols (for example, a set value (D) of the 'protocol #1' and a set value (D) of the 'protocol #2') are to be assigned one part (A), or a set value (D) of one protocol (for example, a set value (D) of the 'protocol #1' or a set value (D) of the 'protocol #2') is to be assigned one part (A).

The MRI apparatus 100 then creates an imaging-condition edit screen by using a group of associated set values and definition information about each parameter, and outputs the created imaging-condition edit screen onto the display unit 25.

According to the first embodiment, such function of the MRI apparatus 100 is implemented mainly by the computer system 20. Therefore, the computer system 20 according to the first embodiment is explained below in detail.

Figure 3:
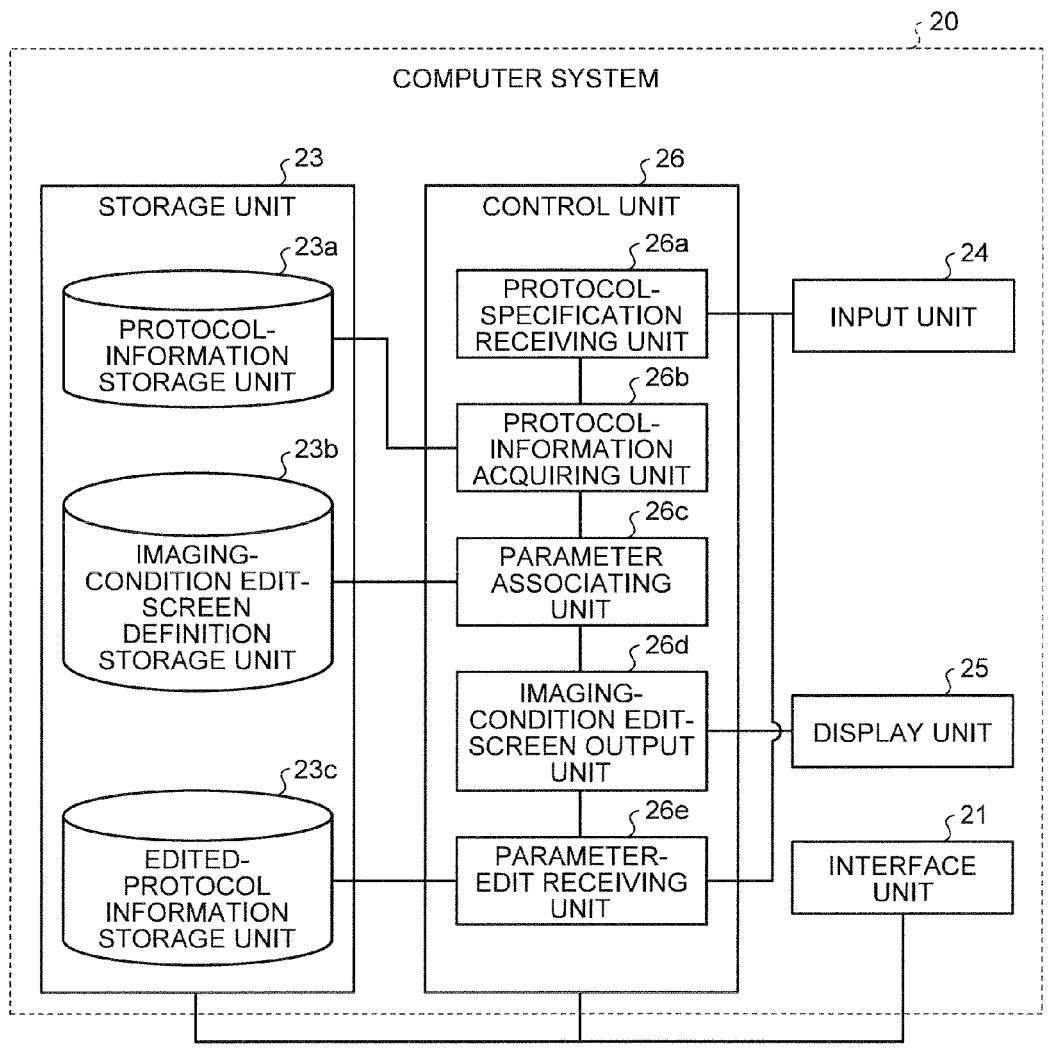
FIG. 3 is a functional block diagram of a configuration of a computer system 20 according to the first embodiment.

FIG. 3 is a functional block diagram of a configuration of the computer system 20 according to the first embodiment. As shown in FIG. 3, the storage unit 23 according to the first embodiment includes a protocol-information storage unit 23a, an imaging-condition edit-screen definition storage unit 23b, and an edited-protocol information storage unit 23c. Moreover, the control unit 26 according to the first embodiment includes a protocol-specification receiving unit 26a, a protocol-information acquiring unit 26b, a parameter associating unit 26c, an imaging-condition edit-screen output unit 26d, and a parameter-edit receiving unit 26e.

The protocol-information storage unit 23a stores a group of set values that are set in respective parameters with respect to each protocol. The protocol-information storage unit 23a corresponds to the 'protocol-information storage unit', which is explained with reference to FIG. 2. A group of set values stored by the protocol-information storage unit 23a is used for processing by the protocol-information acquiring unit 26b.

FIG. 4 is a schematic diagram for explaining the protocol-information storage unit 23a. As shown in FIG. 4, for example, the protocol-information storage unit 23a stores therein a parameter, a set value, and a settable range (a range of settable numeric values), in an associated manner. The 'protocol #1' shown in FIG. 4 is a protocol for acquiring a T1W image, and the 'protocol #2' is a protocol for acquiring a T2W image. Parameters that are elements of the imaging conditions of the 'protocol #1' are, for example, parameters 'Imaging Flip Angle', 'Acquisition Order', 'PE FOV', 'sequence identifier', 'TR', 'NAQ', and 'PE Matrix'.

For example, a row of the parameter 'PE FOV', a set value '24.0', and a settable range '8.2, 50.0, 0.1' indicates that the set value actually set in the parameter 'PE FOV' is '24.0', the range of numeric values that can be set as a set value of the parameter 'PE FOV' is between '8.2' and '50.0' in units of '0.1'. Moreover, for example, a row of the parameter 'TR', a set value '540.0', and a settable range '24.0, 10000.0, 0.1' indicates that the set value set in the parameter 'TR' is '540.0', the range of numeric values that can be set as a set value of the parameter 'TR' is between '24.0' and '10000.0' in units of '0.1'. A set value stored by the protocol-information storage unit 23a is, for example, a set value that is preset for assisting an operator (preset value).

Although, for convenience of explanation, only the 'protocol #1' and the 'protocol #2' are shown in FIG. 4 as protocol information stored by the protocol-information storage unit 23a, the number of pieces of protocol information stored by the protocol-information storage unit 23a is not limited. Generally, the protocol-information storage unit 23a stores a number of pieces of protocol information including other protocols. Moreover, the protocol-information storage unit 23a can further store the type of a settable range, although it is omitted in FIG. 4. For example, it is a distinction of use, for example, when the type of a settable range is 'R' (Range type), a tool displayed on an imaging-condition edit screen can be displayed as a slider; or when the type is 'E' (Enumerate type), a tool is displayed in a pull down menu.

Returning to FIG. 3, the imaging-condition edit-screen definition storage unit 23b stores definition information that defines a command with respect to each parameter to output an imaging-condition edit screen onto the display unit 25. The imaging-condition edit-screen definition storage unit 23b corresponds to the imaging-condition edit-screen definition (E) that is explained above with reference to FIG. 2. Moreover, definition information stored by the imaging-condition edit-screen definition storage unit 23b is used for, for example, processing by the parameter associating unit 26c.

FIG. 5 is a schematic diagram for explaining the imaging-condition edit-screen definition storage unit 23b. As shown in FIG. 5, the imaging-condition edit-screen definition storage unit 23b stores therein definition information that is described by using the eXtensible Markup Language (XML). However, it is not limited to this, and, for example, can be definition information that is described in an original format. In FIG. 5, combinations of an arrow and a reference letter (an arrow a and an arrow b) are added for convenience of explaining FIG. 5, and they are not definition information.

For example, commands that are described between tags <ScanEditDic> and </ScanEditDic> denoted by the arrow a are definition information. Moreover, for example, commands described between tags <template name="Core" class="Board" rows="8" cols="2"> and </template> denoted by the arrow b are definition information for displaying an imaging-condition edit screen for a tab named 'Core', among imaging-condition edit screens.

Furthermore, definition information about each parameter is a command described by using a tag <portion>. Definition information about each parameter is explained below with reference to FIGS. 6A to 6C. FIGS. 6A to 6C are schematic diagrams for explaining definition information about each parameter. Any of definition information in FIGS. 6A to 6C is definition information about each parameter.

FIG. 6A depicts definition information for outputting an imaging-condition edit screen for the parameter 'PE FOV' onto the display unit 25, and corresponds to '(C)' that is explained above with reference to FIG. 2. 'label="PE FOV"' means to output the parameter 'PE FOV' onto the display unit 25. Moreover, 'class="Scale"' expresses to output a tool defined by 'Scale' onto the display unit 25, in order to receive edit of imaging conditions. Furthermore, 'plif="PEFOV"' is an identifier that identifies a parameter, and corresponds to '(B)' that is explained above with reference to FIG. 2.

FIG. 6B depicts definition information for outputting an imaging-condition edit screen for the parameter 'TR' onto the display unit 25, and corresponds '(C)' that is explained above with reference to FIG. 2. 'label="TR#1"' means to output the 'TR#1' onto the display unit 25. Moreover, 'class="Scale"' expresses to output the tool defined by 'Scale' onto the display unit 25, in order to receive edit of imaging conditions. Furthermore, 'plif="#1.TR"' is an identifier that identifies a parameter, and corresponds to '(B)' that is explained above with reference to FIG. 2.

FIG. 6C depicts definition information for outputting an imaging-condition edit screen for the parameter 'TR' onto the display unit 25, and corresponds '(C)' that is explained above with reference to FIG. 2. 'label="TR#2"' means to output the 'TR#2' onto the display unit 25. Moreover, 'class="Scale"' expresses to output the tool defined by 'Scale' onto the display unit 25, in order to receive edit of imaging conditions. Furthermore, 'plif="#2.TR"' is an identifier that identifies a parameter, and corresponds to '(B)' that is explained above with reference to FIG. 2.

Here, again focusing on the identifiers that identify the parameters described in FIGS. 6A to 6C, the identifier 'plif="PEFOV"' is an identifier that includes only a variable name, on the other hand, the identifiers 'plif="#1.TR"' and 'plif="#2.TR"' of FIGS. 6B and 6C are an identifier that includes a combination of a protocol name and a variable name.

In other words, an identifier that includes only a variable name is a parameter of which reception of edit is to be common to a plurality of protocols, and an identifier that includes a combination of a protocol name and a variable name is a parameter of which reception of edit is not to be common to a plurality of protocols. In this way, according to the first embodiment, an identifier that identifies a parameter includes information that identifies whether it is a parameter of which reception of edit is to be common to a plurality of protocols.

Returning to FIG. 3, the edited-protocol information storage unit 23c stores edited protocol information. Specifically, when edit of parameter is received by the parameter-edit receiving unit 26e and set values are changed, the edited-protocol information storage unit 23c stores a group of changed set values that are set in respective parameters. The edited protocol information stored by the edited-protocol information storage unit 23c is sent to the sequence control unit 10 via the interface unit 21, and used for a main scan by the MRI apparatus 100. Edited protocol information stored by the edited-protocol information storage unit 23c is stored similarly to the protocol-information storage unit 23a, for example, as information shown in FIG. 4.

Returning to FIG. 3, the protocol-specification receiving unit 26a receives a specification of protocols of which edit of parameters is to be received. Specifically, the protocol-specification receiving unit 26a receives a specification of protocols via the input unit 24, and notifies the protocol-information acquiring unit 26b of the received specification information about the protocols.

For example, the protocol-specification receiving unit 26a outputs protocol information stored by the protocol-information storage unit 23a to the display unit 25, and receives a specification of protocols as an operator inputs a check into a check box. Moreover, for example, the protocol-specification receiving unit 26a outputs an input screen for receiving a specification of protocols to the display unit 25, and receives a specification of protocols as an operator inputs a name of protocol. The method of receiving a specification of protocols is not limited to the above method, and can be another method as long as a specification can be received by using a known technology.

When a plurality of protocols is specified, the protocol-information acquiring unit 26b refers to the protocol-information storage unit 23a with respect to each of the specified protocols, and acquires a corresponding group of set values with respect to each protocol. Specifically, when the protocol-information acquiring unit 26b is notified of specification information about protocols from the protocol-specification receiving unit 26a, the protocol-information acquiring unit 26b refers the protocol-information storage unit 23a by using the notified specification information, and acquires protocol information that is stored by being associated with the specification information. Moreover, the protocol-information acquiring unit 26b sends the acquired protocol information to the parameter associating unit 26c.

For example, when specification information about the 'protocol #1' and the 'protocol #2' is notified from the protocol-specification receiving unit 26a, the protocol-information acquiring unit 26b refers to the protocol-information storage unit 23a by using the 'protocol #1' and the 'protocol #2', and acquires, for example, protocol information shown in FIG. 4. The protocol-information acquiring unit 26b sends the protocol information shown in FIG. 4 to the parameter associating unit 26c.

The parameter associating unit 26c associates a group of set values acquired by the protocol-information acquiring unit 26b with respect to each protocol, with definition information about each parameter stored by the imaging-condition edit-screen definition storage unit 23b, in accordance with whether it is a parameter of which reception of edit is to be common to a plurality of protocols. Specifically, when protocol information is sent from the protocol-information acquiring unit 26b, the parameter associating unit 26c associates the sent protocol information with definition information about each parameter stored by the imaging-condition edit-screen definition storage unit 23b, and sends a result of the association to the imaging-condition edit-screen output unit 26d.

For example, the parameter associating unit 26c reads the definition information shown in FIG. 5 from the imaging-condition edit-screen definition storage unit 23b. The parameter associating unit 26c then performs association with definition information about each parameter, i.e., with respect to each command described by using a tag <portion>.

For example, explaining with reference to FIG. 6A, because 'plif="PEFOV"' is an identifier that includes only a variable name, and it denotes a parameter of which reception of edit is to be common to a plurality of protocols, the parameter associating unit 26c associates it with all of the protocol information sent from the protocol-information acquiring unit 26b. In other words, assuming the protocol information sent from the protocol-information acquiring unit 26b is the protocol information shown in FIG. 4, the parameter associating unit 26c associates the both of the parameter 'PE FOV' of the 'protocol #1' and the parameter 'PE FOV' of the 'protocol #2' with the definition information shown in FIG. 6A.

Moreover, for example, explaining with reference to FIG. 6B, because 'plif="#1.TR"' is an identifier that includes a combination of a protocol name and a variable name, it denotes a parameter of which reception of edit is not to be common to a plurality of protocols, the parameter associating unit 26c associates it with one of the protocol information sent from the protocol-information acquiring unit 26b. For example, when '#1' means associating with the protocol that is specified at first, the parameter associating unit 26c associates the parameter 'TR' of the 'protocol #1' with definition information shown in FIG. 6B.

Moreover, for example, explaining with reference to FIG. 6C, because 'plif="#2.TR"' is an identifier that includes a combination of a protocol name and a variable name, it denotes a parameter of which reception of edit is not to be common to a plurality of protocols, the parameter associating unit 26c associates it with one of the protocol information sent from the protocol-information acquiring unit 26b. For example, when '#2' means associating with the protocol that is specified at second, the parameter associating unit 26c associates the parameter 'TR' of the 'protocol #2' with definition information shown in FIG. 6C.

In this way, by using an identifier included in definition information about each parameter, the parameter associating unit 26c determines whether set values of a plurality of protocols (for example, a set value of the 'protocol #1' and a set value of the 'protocol #2') are to be assigned one piece of definition information, or a set value of one protocol (for example, a set value of the 'protocol #1' or a set value of the 'protocol #2') is to be assigned one piece of definition information. If, for example, three pieces of protocol information are specified, a rule can be separately made, for example, so as to associate first two pieces of protocol information.

The imaging-condition edit-screen output unit 26d creates an imaging-condition edit screen by using a group of set values associated by the parameter associating unit 26c and definition information about each parameter, and outputs the created imaging-condition edit screen to the display unit 25. Specifically, the imaging-condition edit-screen output unit 26d creates an imaging-condition edit screen by using a result of association sent from the parameter associating unit 26c, and outputs the created imaging-condition edit screen to the display unit 25.

FIG. 7 is a schematic diagram for explaining an imaging-condition edit screen. For example, the imaging-condition edit-screen output unit 26d outputs an imaging-condition edit screen shown in FIG. 7 to the display unit 25. In FIG. 7, a tab named 'Core' is selected by an operator, and an imaging-condition edit screen of the tab named 'Core' is output on the display unit 25.

On the imaging-condition edit screen shown in FIG. 7, for example, a tool for receiving edit of the parameter 'PE FOV', a tool for receiving edit of the parameter 'TR' of the 'protocol #1', and a tool for receiving edit of the parameter 'TR' of the 'protocol #2' are output. On the imaging-condition edit screen shown in FIG. 7, parameters of which reception of edit is to be common to a plurality of protocols are arranged in the upper part of the screen, and parameters of which reception of edit is not to be common to a plurality of protocols are arranged in the lower part of the screen.

For example, the imaging-condition edit-screen output unit 26*d* receives from the parameter associating unit 26*c* a result that the definition information in FIG. 6A is associated with the both of the parameter 'PE FOV' of the 'protocol #1' and the parameter 'PE FOV' of the 'protocol #2'. The imaging-condition edit-screen output unit 26*d* then acquires respective set values and settable ranges of the parameter 'PE FOV' of the 'protocol #1' and the parameter 'PE FOV' of the 'protocol #2' from the protocol information shown in FIG. 4.

For example, the imaging-condition edit-screen output unit 26*d* acquires a set value '24.0' and a settable range '8.2, 50.0, 0.1' with respect to the parameter 'PE FOV' of the 'protocol #1'. Moreover, the imaging-condition edit-screen output unit 26*d* acquires a set value '24.0' and a settable range '8.2, 50.0, 0.1' with respect to the parameter 'PE FOV' of the 'protocol #2'.

The imaging-condition edit-screen output unit 26*d* then determines whether the set values are the same between the 'protocol #1' and the 'protocol #2'; and if they are the same, the imaging-condition edit-screen output unit 26*d* creates the imaging-condition edit screen so as to output the same set value to the display unit 25. By contrast, if the set values are not the same; the imaging-condition edit-screen output unit 26*d* creates the imaging-condition edit screen not to output set value to the display unit 25. According to the example in FIG. 4, the set value '24.0' is the same, therefore the imaging-condition edit-screen output unit 26*d* creates the imaging-condition edit screen so as to output the set value '24.0' to the display unit 25.

Moreover, the imaging-condition edit-screen output unit 26*d* compares the settable range of the 'protocol #1' and the settable range of the 'protocol #2', and creates the imaging-condition edit screen so as to output a common settable range the display unit 25. According to the example in FIG. 4, the settable range '8.2, 50.0, 0.1' is also the same, therefore the imaging-condition edit-screen output unit 26*d* creates the imaging-condition edit screen so as to output '8.2, 50.0, 0.1' as a common settable range to the display unit 25.

Although the settable ranges are common in the above example, for example, the same parameter sometimes has a different settable range with respect to each protocol in some cases. In such case, the imaging-condition edit-screen output unit 26*d* according to the first embodiment obtains the minimum value and the maximum value in a settable range common to the all protocols as a common settable range, and creates an imaging-condition edit screen so as to output a range from the obtained minimum value to the obtained maximum value as a settable range to the display unit 25. For example, when a settable range of one protocol is '1 to 10', and a settable range of the other protocol is '3 to 12', a settable range common to the all protocol is '3 to 10'. Accordingly, it can avoid that a set value in an unavailable range is set. If there is no common part between settable ranges, for example, it is in a not-editable state.

In this way, the imaging-condition edit-screen output unit 26*d* outputs a scale of which the settable range is from '8.2' to '50.0', and the actually-set set value is '24.0', as shown in FIG. 7. An operator can edit the set value of the parameter 'PE FOV' by operating a box denoted by the reference letter a displayed on the bar and moving it to the right or left. Alternatively, the operator can edit the set value of the parameter 'PE FOV' also by clicking an arrow denoted by the reference letter b displayed beside the set value.

The imaging-condition edit-screen output unit 26*d*, for example, then receives from the parameter associating unit 26*c* a result that the definition information in FIG. 6B is associated with the parameter 'TR#1' of the 'protocol #1'. The imaging-condition edit-screen output unit 26*d* then acquires a set value and a settable range of the parameter 'TR' of the 'protocol #1' from, for example, the protocol information shown in FIG. 4. For example, the imaging-condition edit-screen output unit 26*d* acquires a set value '540.0' and a settable range '24.0, 10000.0, 0.1' with respect to the parameter 'TR' of the 'protocol #1'.

The imaging-condition edit-screen output unit 26*d* then creates an imaging-condition edit screen so as to output the set value '540.0' to the display unit 25. Moreover, the imaging-condition edit-screen output unit 26*d* creates the imaging-condition edit screen so as to output '24.0, 10000.0, 0.1' as a settable range to the display unit 25. In this way, the imaging-condition edit-screen output unit 26*d* outputs a scale of which the settable range is from '24.0' to '10000.0', with respect to 'TR#1', and the actually-set set value is '540.0', as shown in FIG. 7.

Subsequently, for example, the imaging-condition edit-screen output unit 26*d* receives from the parameter associating unit 26*c* a result that the definition information in FIG. 6C is associated with the parameter 'TR#2' of the 'protocol #2'. The imaging-condition edit-screen output unit 26*d* then acquires a set value and a settable range of the parameter 'TR' of the 'protocol #2' from, for example, the protocol information shown in FIG. 4. For example, the imaging-condition edit-screen output unit 26*d* acquires a set value '20000.0' and a settable range '214.0, 20000.0, 0.1' with respect to the parameter 'TR' of the 'protocol #2'.

The imaging-condition edit-screen output unit 26*d* then creates the imaging-condition edit screen so as to output the set value '20000.0' to the display unit 25. Moreover, the imaging-condition edit-screen output unit 26*d* creates the imaging-condition edit screen so as to output '214.0, 20000.0, 0.1' as a settable range to the display unit 25. In this way, the imaging-condition edit-screen output unit 26*d* outputs a scale of which the settable range is from '214.0' to '20000.0', with respect to 'TR#2', and the actually-set set value is '20000.0', as shown in FIG. 7.

The parameter-edit receiving unit 26*e* receives edit of a parameter that is input onto an imaging-condition edit screen. Specifically, the parameter-edit receiving unit 26*e* receives edit of a parameter that is input onto an imaging-condition edit screen via the input unit 24, and stores the received contents into the edited-protocol information storage unit 23*c* as edited protocol information.

Figure 8:
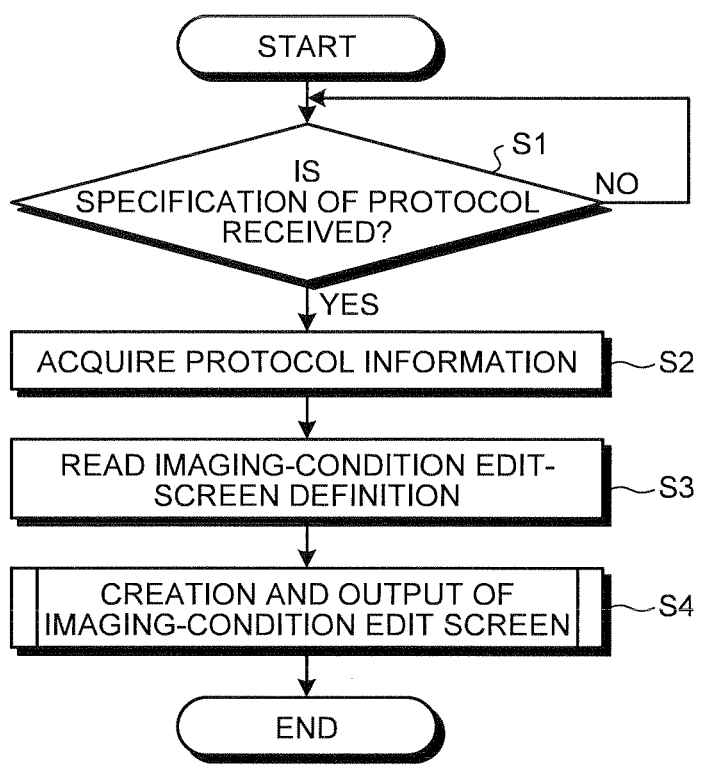
FIG. 8 is a flowchart of a process procedure by the MRI apparatus 100 according to the first embodiment.
Figure 9:
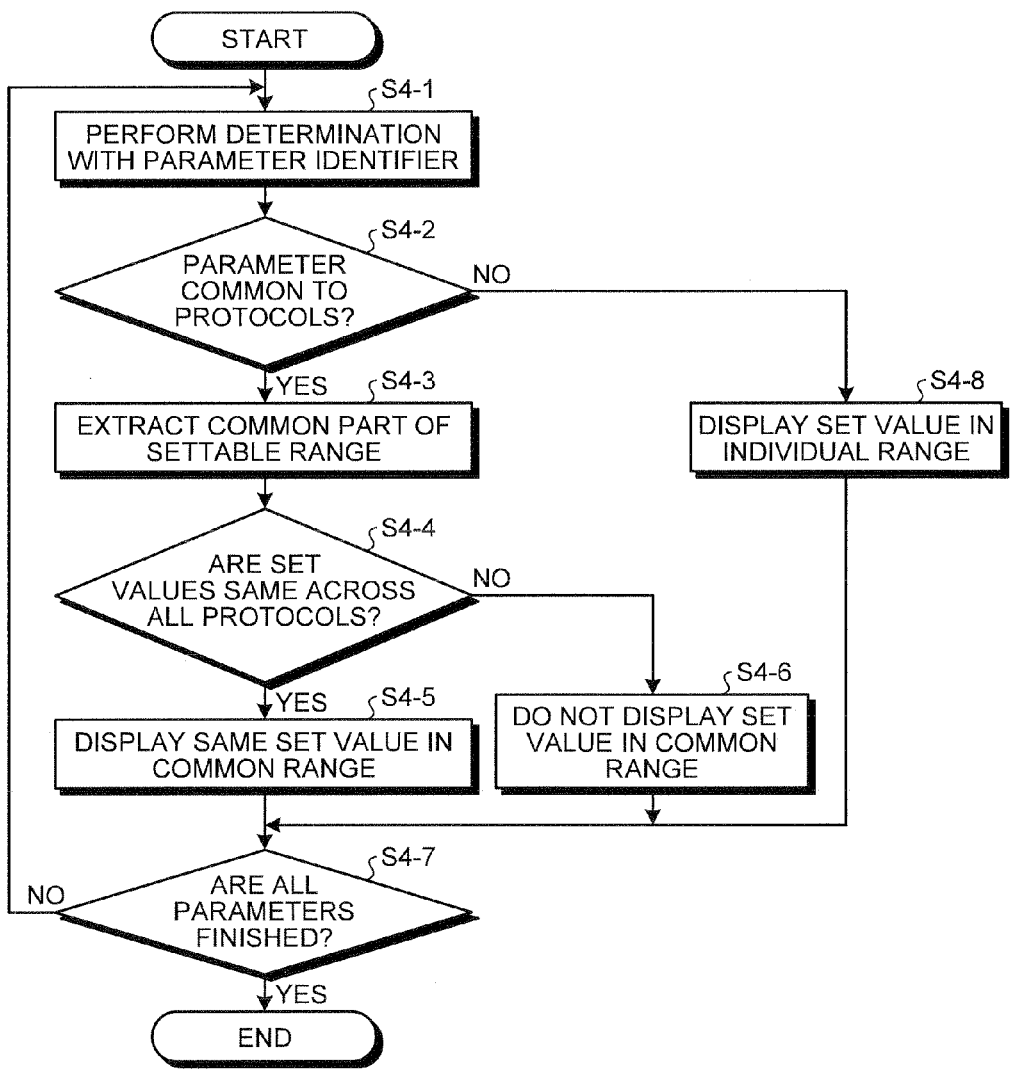
FIG. 9 is a flowchart of a process procedure by the MRI apparatus 100 according to the first embodiment.

A process procedure by the MRI apparatus 100 according to the first embodiment is then explained below. FIGS. 8 and 9 are a flowchart that depicts a process procedure by the MRI apparatus 100 according to the first embodiment.

As shown in FIG. 8, the MRI apparatus 100 according to the first embodiment determines whether a specification of a protocol is received, with the protocol-specification receiving unit 26*a* (Step S1). If it is determined that a specification of protocols is received (Yes at Step S1); the protocol-information acquiring unit 26*b* refers to the protocol-information storage unit 23*a* with respect to each of the specified protocols, and acquires a corresponding group of set values with respect to each protocol (Step S2).

Subsequently, the parameter associating unit 26*c* reads the imaging-condition edit-screen definition from the imaging-condition edit-screen definition storage unit 23*b* (Step S3); and the parameter associating unit 26*c* and the imaging-condition edit-screen output unit 26*d* creates an imaging-condition edit screen, and outputs it onto the display unit 25 (Step S4).

Step S4 is explained below in more detail. As shown in FIG. 9, to begin with, the parameter associating unit 26c determines whether it is a parameter of which reception of edit is common to the protocols, by using a parameter identifier (Step S4-1).

If it is the parameter of which reception of edit is common to the protocols (Yes at Step S4-2); the parameter associating unit 26c notifies so to the imaging-condition edit-screen output unit 26d, and the imaging-condition edit-screen output unit 26d extracts a common part in settable ranges from the protocols (Step S4-3).

Moreover, the imaging-condition edit-screen output unit 26d determines whether set values that are actually set are the same across the all protocols (Step S4-4); and then if they are the same (Yes at Step S4-4), the imaging-condition edit-screen output unit 26d creates an imaging-condition edit screen so as to output the same set value with the common settable range extracted at Step S4-3 onto the display unit 25 (Step S4-5).

By contrast, if the set values that are actually set are not the same (No at Step S4-4); the imaging-condition edit-screen output unit 26d creates an imaging-condition edit screen so as to output only the common settable range extracted at Step S4-3 onto the display unit 25 (not to output set value) (Step S4-6).

At Step S4-2, if it is not the parameter of which reception of edit is common to the protocols (No at Step S4-2); the parameter associating unit 26c notifies so to the imaging-condition edit-screen output unit 26d, and the imaging-condition edit-screen output unit 26d creates an imaging-condition edit screen so as to output a set value with a settable range (individual range) that is preliminarily specified in each individual protocol onto the display unit 25 (Step S4-8).

The parameter associating unit 26c and the imaging-condition edit-screen output unit 26d repeatedly performs processing from Step S4-1 to Step S4-8 until the processing is finished on all of the parameter described in the imaging-condition edit-screen definition, then displays the created imaging-condition edit screen onto the display unit 25, and terminates the processing (Step S4-7).

As described above, the MRI apparatus 100 according to the first embodiment includes the protocol-information storage unit 23a that stores a group of set values set in respective parameters that are elements of imaging conditions, with respect to each protocol. Moreover, the MRI apparatus 100 includes the imaging-condition edit-screen definition storage unit 23b that stores definition information that defines with respect to each parameter a command to output an imaging-condition edit screen for receiving edit of parameter onto the display unit 25. When a plurality of protocols is specified, the protocol-information acquiring unit 26b of the MRI apparatus 100 refers to the protocol-information storage unit 23a with respect to each of the specified protocols, and acquires a group of corresponding set values with respect to each protocol. Furthermore, the parameter associating unit 26c associates a group of set values acquired with respect to each protocol by the protocol-information acquiring unit 26b, with definition information about each parameter stored by the imaging-condition edit-screen definition storage unit 23b, in accordance with whether it is a parameter of which reception of edit is to be common to a plurality of protocols. The imaging-condition edit-screen output unit 26d then creates an imaging-condition edit screen by using a group of set values associated by the parameter associating unit 26c and definition information about each parameter, and outputs the created imaging-condition edit screen onto the display unit 25.

In this way, according to the first embodiment, a parameter can be edited simultaneously with respect to a plurality of protocols having different imaging conditions, so that a burden on an operator can be reduced even when setting imaging conditions with respect to a plurality of protocols.

Here, imaging conditions include various parameters as elements, so that a parameter of which reception of edit can be common to a plurality of protocols and a parameter that is not so are present in a mixed manner. For example, between a protocol for acquiring a T1W image and a protocol for acquiring T2W image, the parameter 'PE FOV' is a parameter of which reception of edit can be common, and the parameter 'TR' is not a parameter of which reception of edit can be common.

At this point, the MRI apparatus 100 according to the first embodiment makes commands to output an imaging-condition edit screen in parts by defining them with respect to each parameter, and distinguishes between 'parameter to be common' and 'parameter not to be common'. Moreover, the MRI apparatus 100 separates commands in parts from actual set values. In this way, imaging-condition edit screens dedicated for a plurality of arbitrarily specified protocols can be dynamically created.

Moreover, according to the first embodiment, a parameter in which a numeric value is set as a set value is included. When a parameter is a parameter of which reception of edit is to be common to a plurality of protocols, the imaging-condition edit-screen output unit 26d checks whether set values that are actually set in respective parameters are the same; and creates an imaging-condition edit screen so as to output the actually-set set value if they are the same, and not to output the set values if they are not the same. According to the first embodiment, when set values of a parameter are not numeric value, an imaging-condition edit screen is created by controlling whether to output a set value in accordance with whether set values are the same (for example, parameter 'Acquisition Order').

In this way, according to the first embodiment, a set value for edit can be appropriately output with respect to a parameter of which reception of edit is to be common to a plurality of protocols.

Furthermore, according to the first embodiment, a range of settable numeric values of a parameter is preliminarily specified with respect to each protocol. For this reason, when a parameter is a parameter of which reception of edit is to be common to a plurality of protocols, the imaging-condition edit-screen output unit 26d compares ranges of predetermined numeric values with respect to each of parameters, and creates an imaging-condition edit screen so as to output a range common to all of the protocols as a range of numeric values that are settable among the protocols.

Therefore, according to the first embodiment, regarding a parameter of which reception of edit is to be common to a plurality of protocols, a settable range for edit of it can be appropriately output.

Although the MRI apparatus 100 according to the first embodiment has been explained above, the MRI apparatus 100 can receive edit of imaging-condition edit-screen definition itself as an external file. The MRI apparatus 100 according to a second embodiment is configured to receive also edit of imaging-condition edit-screen definition itself.

Figure 10:
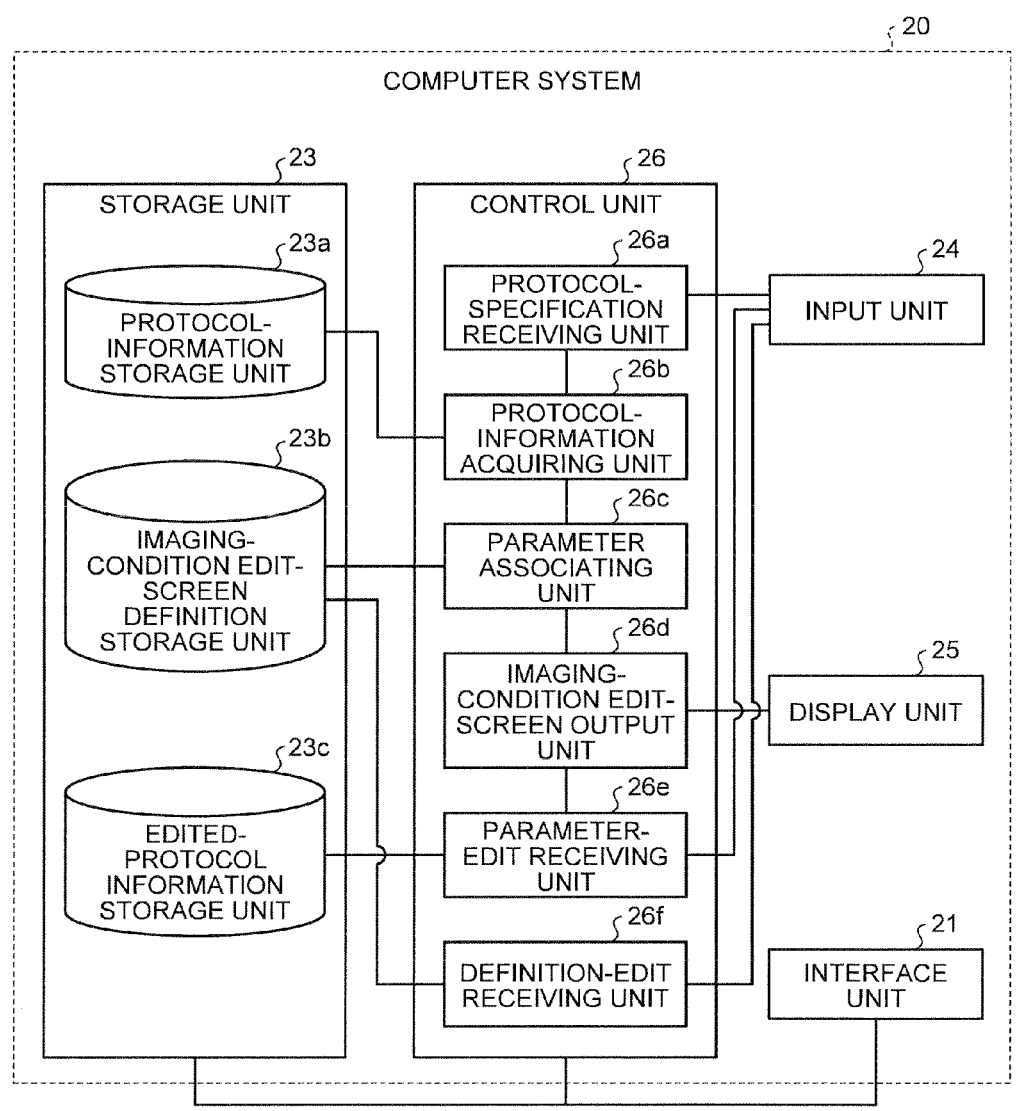
FIG. 10 is a functional block diagram of a configuration of the computer system 20 according to a second embodiment.

FIG. 10 is a functional block diagram of a configuration of the computer system 20 according to the second embodiment. As shown in FIG. 10, the computer system 20 according to the second embodiment further includes a definition-edit receiving unit 26f in the control unit 26. The definition-edit receiving unit 26f receives edit to be input into an imaging-condition edit-screen definition via the input unit 24, and stores the received contents into the imaging-condition edit-screen definition storage unit 23b as an edited imaging-condition edit-screen definition.

FIGS. 11A and 11B are schematic diagrams for explaining edit of imaging-condition edit-screen definitions. For example, the definition-edit receiving unit 26f reads an imaging-condition edit-screen definition from the imaging-condition edit-screen definition storage unit 23b for receiving edit of the imaging-condition edit-screen definition, and outputs the imaging-condition edit-screen definition to the display unit 25, for example, as shown in FIG. 5. The definition-edit receiving unit 26f then receives edit of the imaging-condition edit-screen definition, for example, as shown in FIGS. 11A and 11B.

FIG. 11B depicts an example that an edit of adding definition information (underlined part) is received to FIG. 11A. For example, an operator copies definition information about one sentence starting from the third rows from among four rows of definition information shown in FIG. 11A, and pastes it to the fifth row and afterward. The operator then changes, for example, from '#2' to '#3', only two points, among the definition information about the pasted sentence. Only through such operation, the imaging-condition edit-screen definition turns applicable to three protocols with respect to the parameter 'TR'.

In this way, according to the second embodiment, the MRI apparatus 100 can flexibly change imaging-condition edit-screen definition itself, and can create a different imaging-condition edit screen, for example, in accordance with a request from an operator.

The embodiments described above can be implemented by various different embodiments.

For example, according to the first and the second embodiments, it is assumed a case where an imaging-condition edit screen is one type; however, the embodiment is not limited to this. For example, the imaging-condition edit-screen definition storage unit 23b can store a plurality of kinds of imaging-condition edit-screen definitions. In such case, the parameter associating unit 26c selects an appropriate imaging-condition edit screen, in accordance with a plurality of specified protocols. A third embodiment is explained below.

At first, a modification 1 of the third embodiment is explained below. According to the first embodiment, as protocol information stored by the protocol-information storage unit 23a, a protocol for acquiring a T1W image (hereinafter, 'T1W protocol'), and a protocol for acquiring a T2W image (hereinafter, 'T2W protocol') are listed as examples.

However, as described in the first embodiment, pieces of protocol information stored by the protocol-information storage unit 23a are not limited in number. The protocol-information storage unit 23a stores protocol information about a plurality of kinds of protocols varying in image contrast (difference in brightness).

According to the third embodiment, it is assumed that the protocol-information storage unit 23a further stores protocol information about a protocol for acquiring a Diffusion-weighted (DW) image (hereinafter, 'DW protocol'), and a protocol for acquiring a Fluid Attenuated Inversion Recovery (FLAIR) image (hereinafter, 'FLAIR protocol').

Under such configuration, the imaging-condition edit-screen definition storage unit 23b according to the third embodiment stores a plurality of imaging-condition edit-screen definitions. Moreover, the parameter associating unit 26c selects an appropriate imaging-condition edit-screen definition in accordance with a plurality of specified protocol.

As specification of a plurality of protocols, various patters can be assumed, for example, when the 'DW protocol' and the 'T2W protocol' are specified; when the 'DW protocol' and the 'FLAIR protocol' are specified; the 'DW protocol' and the 'T1W protocol' are specified, and the 'T2W protocol' and the 'FLAIR protocol' are specified. Cases are not limited to those two protocols are specified, and a case where three or more protocols are to be specified can be assumed.

Here, a condition whether it is a parameter of which reception of edit is to be common to a plurality of protocols sometimes varies in accordance with a combination of specified protocols, in some cases. Therefore, the imaging-condition edit-screen definition storage unit 23b stores an imaging-condition edit-screen definition with respect to each of such combinations of a plurality of protocols.

It is explained below with examples. The following description only explains simply an example of relation between a combination of protocols and a set value set in a parameter, and a set value explained below is not necessarily to be set.

For example, when the 'DW protocol' and the 'T2W protocol' are specified as a plurality of protocols, a parameter 'Interleaving' that is an element of imaging conditions is defined as "a parameter of which reception of edit is to be common to a plurality of protocols". The reason for this is because the parameter 'Interleaving' is a parameter in which set values 'ON' and 'OFF' are set in accordance with whether to take slices alternately (discretely) or to take them continuously, and 'ON' is to be set as a set value in any case of the 'DW protocol' and the 'T2W protocol'.

Consequently, as explained above with reference to FIG. 6A, definition information for outputting an imaging-condition edit screen of the parameter 'Interleaving' to the display unit 25 is an identifier including only a variable name.

On the other hand, for example, when the 'DW protocol' and the 'FLAIR protocol' are specified as a plurality of protocols, even the same parameter 'Interleaving' is defined, in turn, as "a parameter of which reception of edit is not to be common to a plurality of protocols". The reason for this is because in a case of the 'DW protocol', 'ON' is set as a set value as described above; however, 'OFF' is set as a set value in a case of the 'FLAIR protocol'.

Consequently, as explained above with reference to FIGS. 6B and 6C, definition information for outputting the imaging-condition edit screen of the parameter 'Interleaving' to the display unit 25 is an identifier including a combination of a protocol name and a variable name.

In this way, depending on a parameter, conditions "whether it is a parameter of which reception of edit is to be common to a plurality of protocols" vary in accordance with a combination of specified protocols. For this reason, the imaging-condition edit-screen definition storage unit 23b according to the third embodiment defines and stores an imaging-condition edit-screen definition as shown in FIG. 5 with respect to each of such combinations of a plurality of protocols.

In such case, the parameter associating unit 26c refers to the imaging-condition edit-screen definition storage unit 23b by using a combination of the protocols received by the protocol-specification receiving unit 26a, and selects an appropriate imaging-condition edit-screen definition in accordance with the combination.

For example, a parameter 'Contrast Time of Echo (TE)', a parameter 'Contrast Repetition Time (TR)', and a parameter 'Matrix', there are parameters to be defined as "a parameter of which reception of edit is not to be common to a plurality of protocols", even if any protocol is combined. Moreover, for example, a parameter 'Slice Thickness', and a parameter 'Filed of View', there are parameters to be defined as "a parameter of which reception of edit is to be common to a plurality of protocols", even if any protocol is combined.

A modification 2 of the third embodiment is explained below. The modification 1 explains that there is a case where a condition whether it is a parameter of which reception of edit is to be common to a plurality of protocols varies in accordance with a combination of specified protocols, the disclosed technology is not limited to this.

A condition whether it is a parameter of which reception of edit is to be common to a plurality of protocols sometimes varies in accordance with a combination with an imaging target portion in some cases, in additions to a combination of specified protocols.

This means that, for example, when the 'DW protocol' and the 'T2W protocol' are specified as a plurality of protocols, there is a parameter of which a condition whether it is a parameter of which reception of edit is to be common to a plurality of protocols varies, further in accordance with whether an imaging target portion is 'head' or 'abdomen'.

In order to cope with such situation, the imaging-condition edit-screen definition storage unit 23b according to the modification 2 individually defines and stores an imaging-condition edit-screen definition shown in FIG. 5, with respect to each of combinations of 'a combination of a plurality of protocols' and 'an imaging target portion'.

In such case, the parameter associating unit 26c refers to the imaging-condition edit-screen definition storage unit 23b by using a combination of 'a combination of a plurality of protocols' received by the protocol-specification receiving unit 26a and an 'imaging target portion', and selects an appropriate imaging-condition edit-screen definition in accordance with the combination.

A concrete method by which the parameter associating unit 26c acquires information about 'an imaging target portion' is explained below in a modification 3 of the third embodiment.

The modification 3 is explained below. As described above, when the imaging-condition edit-screen definition storage unit 23b stores a plurality of imaging-condition edit-screen definitions, the parameter associating unit 26c is assumed to select an imaging-condition edit-screen definition based on some information.

As such selection, for example, "a method of selection based on information obtained by the MRI apparatus 100 as a single apparatus", or "a method of selection based on information obtained from a Laboratory Information System (LIS) or a Hospital Information System (HIS) connected to the MRI apparatus 100" is assumed.

At first, 'the method of selection based on information obtained by the MRI apparatus 100 as a single apparatus' is explained below.

In the case of the modification 1, the parameter associating unit 26c refers to the imaging-condition edit-screen definition storage unit 23b by using a combination of a plurality of protocols received by the protocol-specification receiving unit 26a, and selects an appropriate imaging-condition edit screen in accordance with the combination. In other words, in the case of the modification 1, the parameter associating unit 26c needs only 'information about protocols of which specification is received' as information for selecting an imaging-condition edit-screen definition.

On the other hand, in a case of the modification 2, the parameter associating unit 26c needs to refer to the imaging-condition edit-screen definition storage unit 23b by using a combination of the 'combination of a plurality of protocols' received by the protocol-specification receiving unit 26a and a 'imaging target portion', and to select an appropriate imaging-condition edit screen in accordance with the combination. In other words, in the case of the modification 2, the parameter associating unit 26c needs 'information about an imaging target portion' in addition to 'information about protocols of which specification is received' as information for selecting an imaging-condition edit-screen definition.

Regarding how to acquire 'information about an imaging target portion', for example, the parameter associating unit 26c uses 'information about an imaging target portion' that is already input into the MRI apparatus 100 before outputting an imaging-condition edit screen. In other words, the MRI apparatus 100 outputs an imaging-condition edit screen, for example, as shown in FIG. 7, to the display unit 25 in a stage of imaging planning; however, in an earlier stage, the MRI apparatus 100 sometimes outputs, for example, a screen for receiving specification of an imaging target portion to the display unit 25, and receives input by an operator in some cases. In such case, the parameter associating unit 26c can use the 'information about an imaging target portion' of which input is already received.

Alternatively, for example, the parameter associating unit 26c identifies an imaging target portion from information which coil is to be used for imaging, and uses a result of the identification as 'information about an imaging target portion' for selecting an imaging-condition edit-screen definition. In other words, the MRI apparatus 100 sometimes receives a connection of a coil to be used for imaging, prior to outputting the imaging-condition edit screen as shown in FIG. 7 to the display unit 25. In such case, for example, from information that a coil to be used for imaging is a 'head coil', the parameter associating unit 26c specifies that the imaging target is 'head', and uses the information as 'information about the imaging target portion' for selecting an imaging-condition edit-screen definition.

The latter, the "method of selection based on information obtained from a Laboratory Information System (LIS) or a Hospital Information System (HIS) connected to the MRI apparatus 100", is then explained below.

The MRI apparatus 100 can also acquire 'information about protocols of which specification is received' and/or 'information about an imaging target portion' that are needed for selecting an imaging-condition edit-screen definition from a Laboratory Information System or a Hospital Information System.

For example, suppose the MRI apparatus 100 acquires order information that 'imaging of "head" by MRI is needed.' about a patient, from a Laboratory Information System. In such case, the parameter associating unit 26c uses the order information as 'information about an imaging target portion'.

Moreover, for example, suppose the MRI apparatus 100 acquires order information that 'imaging of "head" by MRI is needed. A symptom of "dizziness" is observed.' about a patient, from a Laboratory Information System.

Moreover, the parameter associating unit 26c is assumed to preliminarily store a predetermined algorithm of selecting protocols and an imaging target portion based on the order information.

In such case, when order information about "head" and "dizziness" is received, the parameter associating unit 26c inputs the order information into a predetermined algorithm, and obtains a result such that imaging should be performed by using the 'DW protocol' and the 'T2W protocol', and the imaging target portion is "head".

The parameter associating unit 26c can then select an imaging-condition edit-screen definition by using the result.

The example described above is only an example. Not limited to the example described above, the parameter associating unit 26c can specify 'information about protocols of which specification is received' and 'information about the imaging target portion' from information obtained from a medical information system, such as a Laboratory Information System or a Hospital Information System, and can select an imaging-condition edit-screen definition by using the specified information. Moreover, the parameter associating unit 26c can specify 'information about protocols of which specification is received' and 'information about the imaging target portion', by combining the various kinds of methods described above.

According to the MRI apparatus of an embodiment can reduce a burden on an operator.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus that can execute a plurality of kinds of protocols varying in image contrast, the magnetic resonance imaging apparatus comprising:
   a storage unit that stores imaging conditions about the plurality of kinds of protocols; and
   an output unit that outputs onto a display unit an edit screen for receiving edit of a parameter that is an element of the imaging conditions, wherein the edit screen is output by being separated into a common part that receives edit of parameter common to a plurality of kinds of protocols varying in image contrast, and an individual part that individually receives edit of parameter with respect to each protocol.

2. The magnetic resonance imaging apparatus according to claim 1, further comprising a specification receiving unit that receives a specification of the plurality of kinds of protocols, wherein the edit screen changes the common part and the individual part, in accordance with a plurality of kinds of protocols of which the specification is received.

3. The magnetic resonance imaging apparatus according to claim 1, further comprising a definition-information storage unit that stores definition information that defines parameters that are elements of the imaging conditions by categorizing the parameters into a parameter of which edit is to be received common to a plurality kinds of protocols, and a parameter of which edit is to be individually received with respect to each protocol.

4. The magnetic resonance imaging apparatus according to claim 2, further comprising a definition-information storage unit that stores definition information that defines parameters that are elements of the imaging conditions by categorizing the parameters into a parameter of which edit is to be received common to a plurality kinds of protocols, and a parameter of which edit is to be individually received with respect to each protocol.

5. The magnetic resonance imaging apparatus according to claim 3, wherein the definition-information storage unit is an external file that can receive edit of the definition information.

6. The magnetic resonance imaging apparatus according to claim 4, wherein the definition-information storage unit is an external file that can receive edit of the definition information.

7. The magnetic resonance imaging apparatus according to claim 5, wherein the edit screen is created based on definition information stored in the external file.

8. The magnetic resonance imaging apparatus according to claim 6, wherein the edit screen is created based on definition information stored in the external file.

9. The magnetic resonance imaging apparatus according to claim 1, wherein the plurality of kinds of protocols includes at least two kinds among a protocol for acquiring a longitudinal-relaxation weighted image, a protocol for acquiring a transverse-relaxation weighted image, a protocol for acquiring a diffusion weighted image, and a protocol for acquiring a Fluid Attenuated Inversion Recovery (FLAIR) image.

10. The magnetic resonance imaging apparatus according to claim 1, wherein among the parameters, a parameter of which edit is received common to a plurality of kinds of protocols includes at least one of slice thickness and a field of view.

11. The magnetic resonance imaging apparatus according to claim 3, wherein the definition-information storage unit stores the definition information, with respect to one of each combination of a plurality of protocols, or each combination of a combination of a plurality of protocols and an imaging target portion.

12. The magnetic resonance imaging apparatus according to claim 11, wherein when the definition-information storage unit stores the definition information with respect to each combination of a combination of a plurality of protocols and an imaging target portion, the output unit specifies the imaging target portion based on information received from a medical information system, and outputs the edit screen by using specified imaging target portion.

13. A magnetic resonance imaging apparatus comprising:
    a set-value storage unit that stores a group of set values set in respective parameters that are elements of imaging conditions, with respect to each protocol;
    a definition-information storage unit that stores definition information that defines with respect to each parameter a command to output an edit screen for receiving edit of parameter onto a display unit;
    an acquiring unit that refers to the set-value storage unit with respect to each of specified protocols when a plurality of protocols is specified, and acquires a group of corresponding set values with respect to each protocol;
    an associating unit that associates a group of set values acquired with respect each protocol by the acquiring unit, with definition information about each parameter stored by the definition-information storage unit, in accordance with whether it is a parameter of which reception of edit is to common to a plurality of protocols; and
    an output unit that creates the edit screen by using the group of set values associated by the associating unit and the definition information about each parameter, and outputs created edit screen onto the display unit.

14. The magnetic resonance imaging apparatus according to claim 13, wherein
    the parameters are each to be set with a numeric value as a set value, and
    when a parameter associated by the associating unit is a parameter of which reception of edit is to be common to a plurality of protocols, the output unit checks whether set values actually set in respective parameters are same, and creates the edit screen such that when the set values are same, the set value is to be output, by contrast, when the set values are not same, the set values are not to be output.

15. The magnetic resonance imaging apparatus according to claim 13, wherein the parameters are each configured such that a numeric value is to be set as a set value, and a range of settable numeric values is to be preliminarily specified with respect to each protocol, and when a parameter associated by the associating unit is a parameter of which reception of edit is to be common to a plurality of protocols, the output unit compares ranges of numeric values that are preliminarily specified for respective parameters, and creates the edit screen so as to output a range common to all protocols as a range of numeric values settable across a plurality of protocols.

16. The magnetic resonance imaging apparatus according to claim 14, wherein the parameters are each configured such that a numeric value is to be set as a set value, and a range of settable numeric values is to be preliminarily specified with respect to each protocol, and when a parameter associated by the associating unit is a parameter of which reception of edit is to be common to a plurality of protocols, the output unit compares ranges of numeric values that are preliminarily specified for respective parameters, and creates the edit screen so as to output a range common to all protocols as a range of numeric values settable across a plurality of protocols.

17. The magnetic resonance imaging apparatus according to claim 13, further comprising a definition-information edit-receiving unit that receives edit of definition information stored by the definition-information storage unit, and stores definition information of which edit is received into the definition-information storage unit.

18. The magnetic resonance imaging apparatus according to claim 14, further comprising a definition-information edit-receiving unit that receives edit of definition information stored by the definition-information storage unit, and stores definition information of which edit is received into the definition-information storage unit.

19. The magnetic resonance imaging apparatus according to claim 15, further comprising a definition-information edit-receiving unit that receives edit of definition information stored by the definition-information storage unit, and stores definition information of which edit is received into the definition-information storage unit.

20. The magnetic resonance imaging apparatus according to claim 16, further comprising a definition-information edit-receiving unit that receives edit of definition information stored by the definition-information storage unit, and stores definition information of which edit is received into the definition-information storage unit.

* * * * *